United States Patent [19]
Li

[11] Patent Number: 5,944,892
[45] Date of Patent: Aug. 31, 1999

[54] MULTIPLE STATION CRYSTAL GROWING SYSTEM AND METHOD OF USING SAME

[75] Inventor: Zhixin Li, Hudson, N.H.

[73] Assignee: General Signal Technology Corporation, Stamford, Conn.

[21] Appl. No.: 08/807,013

[22] Filed: Feb. 27, 1997

Related U.S. Application Data

[60] Provisional application No. 60/012,431, Feb. 28, 1996.

[51] Int. Cl.[6] .................................................. C30B 35/00
[52] U.S. Cl. ............................ 117/208; 117/201; 117/202
[58] Field of Search ..................................... 117/200, 201, 117/202, 208; 414/217

[56] References Cited

U.S. PATENT DOCUMENTS

| | | | |
|---|---|---|---|
| 4,036,595 | 7/1977 | Lorenzini et al. | 117/202 |
| 4,410,494 | 10/1983 | Fiegl | 117/202 |
| 4,454,096 | 6/1984 | Lorenzini et al. | 117/202 |
| 5,641,354 | 6/1997 | Sakauchi et al. | 117/200 |

*Primary Examiner*—Felisa Hiteshew
*Attorney, Agent, or Firm*—Kudirka & Jobse, LLP

[57] ABSTRACT

A crystal growing system has a plurality of crystal growing stations which are each comprised of a crucible, furnace, vacuum chambers and related equipment which is continuously used during the actual crystal growing process. A central process control console is connected to each crystal growing station so that growing parameters for all stations can be controlled from a single location. A common server unit services all crystal growing stations. The server unit is movable so that it can be positioned at each station both prior to initiating crystal formation and subsequent to completing crystal formation in order to service the station before and after the crystal growing operation. The server unit comprises a movable support structure which can be rolled along a set of tracks to be positioned sequentially adjacent to each station. The server unit includes a main hoist constructed to move a receiving chamber, either alone or together with a transition chamber. A feeder hoist and charge feeder also are included as part of the server unit in order to charge each crystal growing station.

13 Claims, 5 Drawing Sheets

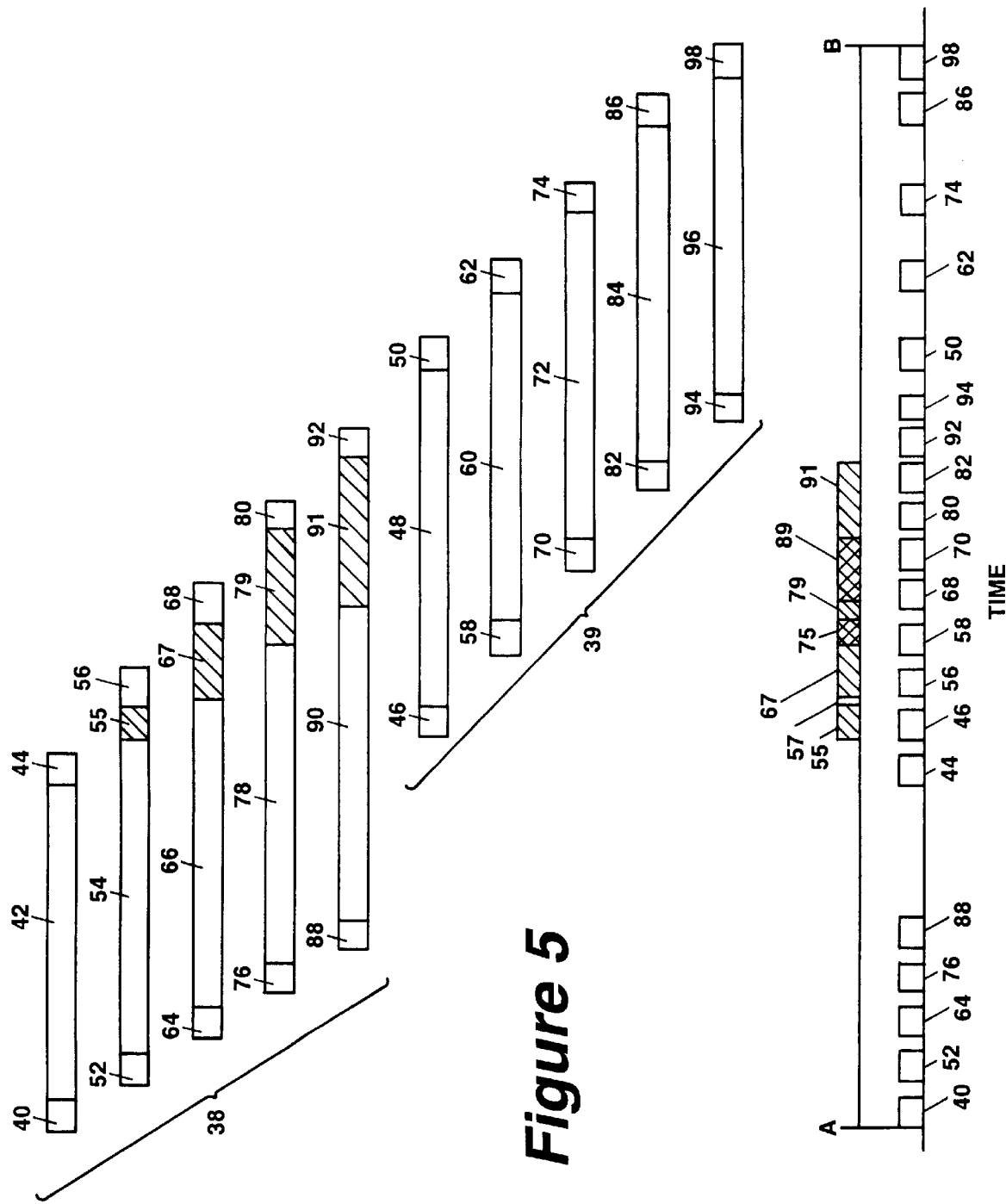

MULTIPLE STATION CRYSTAL GROWING SYSTEM AND METHOD OF USING SAME

This application claims benefit of Provisional application 60/012,431 Feb. 28, 1996.

FIELD OF THE INVENTION

This invention relates to a method and apparatus for growing crystals from a molten charge material. More particularly, this invention relates to managing and using systems of crystal growing furnaces.

BACKGROUND OF THE INVENTION

Several techniques are known in the art for growing crystals. The Czochralski process is the most widely used of these processes. In the Czochralski process, a heated crucible is provided for holding a liquid melt form of a charge material from which the crystal is to be grown. The melt is maintained at a temperature slightly above the solidification temperature of the charge material. A crystal seed is placed at one end of a cable or rod that enables the seed to be positioned into the melt material and then to be raised out of the melt material. The seed can be either a sample of the desired crystal material or any other material that has a higher melting temperature and the same crystal structure as the melt material in its solid form. When the seed is lowered into the melt material, it causes a local decrease in melt temperature, as is known to those skilled in the art, which results in a portion of the melt material crystallizing around and below the seed. Thereafter, the seed is slowly withdrawn from the melt and into a crystal growth chamber by a crystal puller system. As the seed is withdrawn, the portion of the newly formed crystal that remains within the melt essentially acts an extension of the seed and causes melt material to crystallize around and below it. This process continues as the crystal is withdrawn from the melt, resulting in crystal growth as the seed is continually raised away from the melt. While the crystal is being pulled it is also rotated about the axis along which it is being pulled so as to minimize undesirable temperature gradients in the crystal. When this process mode is effected, the crucible containing the melt also is rotated at a speed essentially the same speed as the crystal is being rotated so that force gradients in the crystal also are minimized.

The crystal is withdrawn from the growth chamber and into a transition chamber located above the crucible where the temperature is lower than that of the crucible. The crystal is finally drawn from the transition chamber into an elongated receiving chamber shaped to accommodate an extended length of crystal. Cooling of the crystal is achieved by passing a cooled heat exchange fluid, such a water, through the walls of the transition chamber which functions to remove heat from an inert gas surrounding the crystal and to remove radiant heat emitted from the crystal. It is current practice also to pass an inert gas from the receiving chamber into the transition chamber at a controlled temperature thereby to effect further cooling of the crystal as it passes from the transition chamber into the receiving chamber. The crystal growth process is time consuming, typically requiring about 72 hours, during which the seed crystal is slowly and continuously pulled away from the crucible containing the melt.

The crystal growth process is essentially a batch process. When the crystal fills the receiving chamber and production of the crystal is complete, the furnace is turned off and cooled down and the receiving chamber is decoupled either from the transition chamber or is decoupled, together with the transition chamber, from the growth chamber. The decoupled assembly, including the receiving chamber then is lifted away from the remaining portion of the crystal growth assembly and transported, usually by rotating it, to a station where the relatively heavy crystal can be safely recovered.

To restart the crystal growth process, the crucible is charged with the solid charge material for the crystal in an amount usually sufficient to complete the crystal growth, although some crystal growing systems have the capability to add solid charge material during the growth process by means of special feeder mechanisms. The receiving/transition chamber of the crystal growth apparatus is then coupled to the stationary portion of the crystal growth apparatus, a vacuum is established within the assembly, and the furnace is turned on to melt the charge material.

Since the receiving and transition chamber sections of the growing chamber are heavy, a conventional crystal growing furnace uses a primary hoist apparatus to lift and rotate the decoupled chambers upon completion of the crystal growth cycle and when initiating a new crystal growth cycle. In addition, some crystal growing systems use a feeder mechanism which contains a solid polycrystalline material used to charge the crucible at the beginning of a growth cycle. Since the charge material is heavy, a feed hoist is utilized to position the feeder for charging.

Further, a crystal growing furnace incorporates a process control operator's console in order to control process variables to assure production of satisfactory crystals. The process control console typically includes conventional elements such as a computer, programmable logical controllers, software and user interfaces. Among the process parameters regulated by the process control console are the rate and amount of energy supplied to the crucible, the rate of cooling (which is varied by controlling heat exchange fluid flow and, if present, inert gas flow within the transition chamber and/or receiving chamber), the rate of crystal rotation, the rate at which the crystal is withdrawn from the melt, rate of crucible rotation and rate of polycrystalline feed material to the crucible.

Conventional crystal growing systems are complicated and expensive to operate. The expense of running a large crystal growing operation where several furnaces are operating in parallel is considerable. First, conventional furnaces occupy large areas of expensive "clean room" floor space which could be used for other apparatus. Furthermore, the multiplicity of auxiliary apparatus required to service the furnaces requires a corresponding large maintenance effort to maintain the devices. It is also time consuming and labor intensive to set up each furnace and monitor each separate furnace station.

Accordingly, it would be desirable to provide a crystal growth system utilizing a plurality of crystal growing furnaces which is less expensive to operate than conventional systems.

In addition, it would be desirable to provide such a crystal growth system utilizing a plurality of crystal growing furnaces which is smaller and more compact than conventional crystal growing systems.

SUMMARY OF THE INVENTION

In accordance with the principles of the present invention, a crystal growing system has a plurality of crystal growing stations which are each comprised of a crucible, furnace, vacuum chambers and related equipment which is continuously used during the actual crystal growing process. A central process control console is connected to each crystal growing station so that growing parameters for all stations can be controlled from a single location. A common server unit services all crystal growing stations. The server unit is movable so that it can be positioned at each station both prior to initiating crystal formation and subsequent to completing crystal formation in order to service the station before and after the crystal growing operation.

In particular, the server unit comprises a movable support structure which can be rolled along a set of tracks to be positioned sequentially adjacent to each station. The server unit includes a main hoist constructed to move a receiving chamber, either alone or together with a transition chamber. A feeder hoist and charge feeder also are included as part of the server unit in order to charge each crystal growing station. The server unit may also include a separate auxiliary hoist for moving a growth chamber portion of the crystal growing apparatus.

The server unit is moved between stations in accordance with a schedule which permits serving each station in an initial stage and a final stage. In the initial stage, the auxiliary hoist may be used to lift and reposition the growth chamber to allow access to the crucible so that it can be cleaned, etc. Then, the growth chamber is repositioned and the feeder and feeder hoist mechanism can be used to position the feeder and deliver a charge to the station crucible.

Next, the primary hoist mechanism is used to position the transition chamber and the receiving chamber. After crystal formation is initiated, the server unit is detached from a crystal growth station and is moved to another crystal growth station for deployment either in an initial stage or in a final stage of the crystal growth process. In a final stage, the receiving chamber, usually together with the transition chamber is detached from the remaining portion of the apparatus so that the crystal can be recovered from the receiving chamber. The server unit can be used with a multiple station crystal growing system by staggering the operating cycles of the crystal growing stations.

BRIEF DESCRIPTION OF THE DRAWINGS

FIG. 5 is a time-based schedule for five growing stations utilized in two cycles.

DESCRIPTION OF THE PREFERRED EMBODIMENTS

Figure 1:
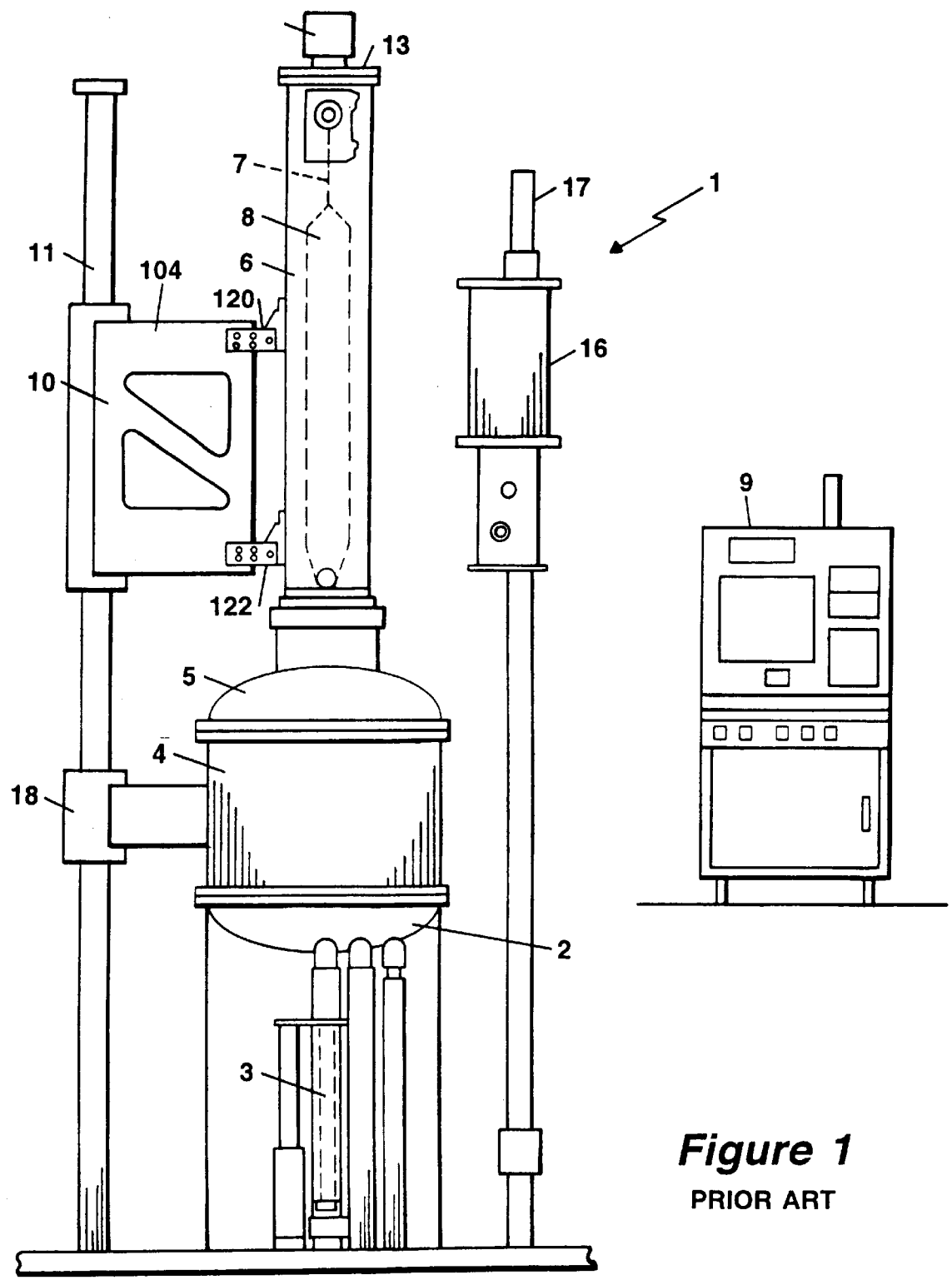
FIG. 1 is a side view of a prior art crystal growing system.
Figure 2:
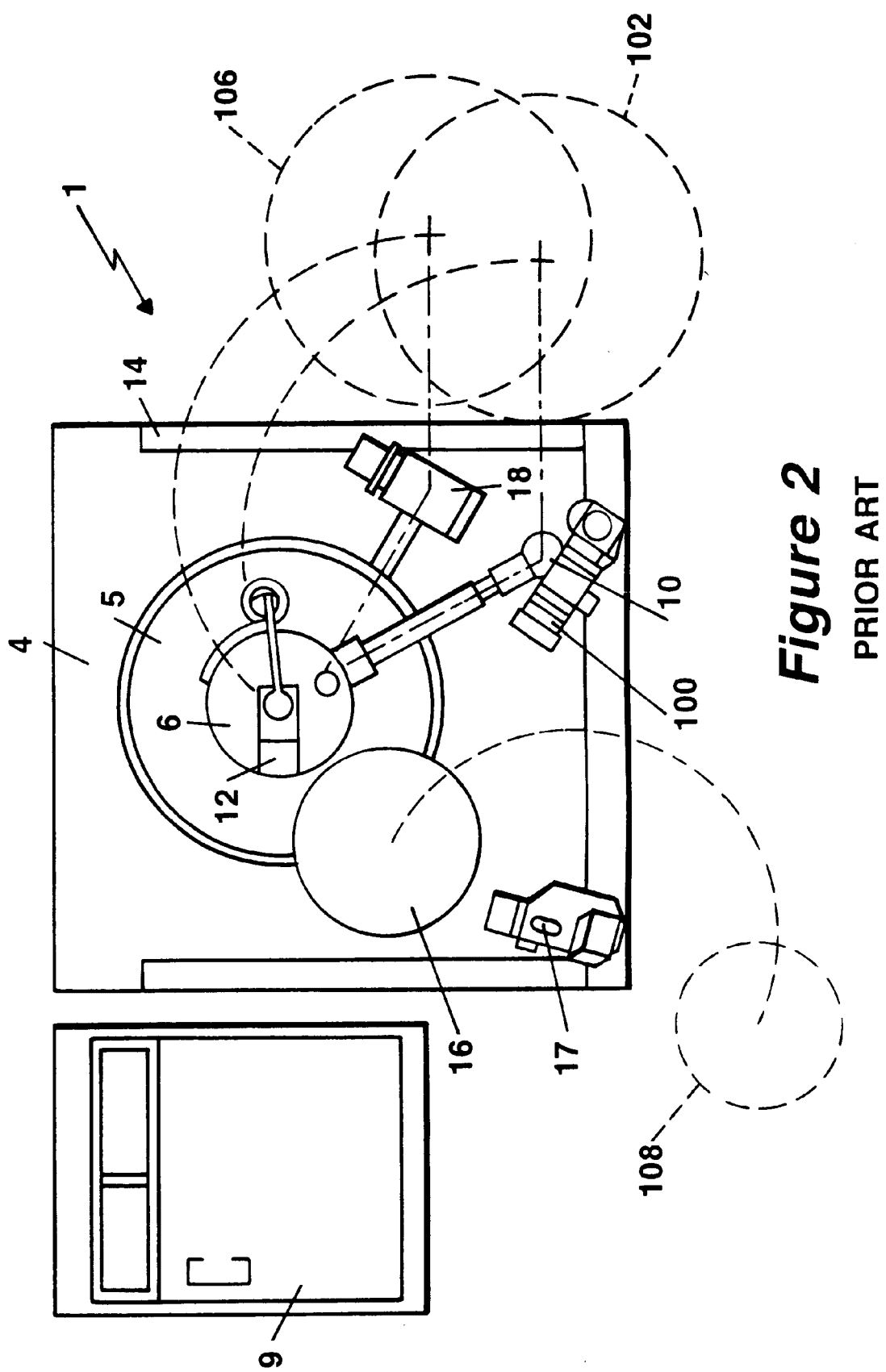
FIG. 2 is a top view of the prior art crystal growing apparatus of FIG. 1.

A self-contained crystal growing apparatus of the prior art is illustrated in FIGS. 1 and 2. The crystal growing apparatus 1 includes a base chamber 2 which houses a crucible (not shown). A crucible lift 3 extends into the base chamber 2 and functions to adjust the position of the crucible within the base chamber 2. The crystal growing apparatus 1 also includes a growth chamber 4 wherein the molten charge material is converted to the crystal. Apparatus 1 also includes a vacuum housing that comprises a transition chamber 5 and a receiving chamber 6 which is positioned above the transition chamber 5. A crystal pulling cable 7 extends vertically within the receiving chamber 6 and draws crystal 8 into the receiving chamber 6 from the transition chamber 5. The pulling cable 7 is drawn up by a pull head 12 which contains a motorized winch and is supported on a rotating plate 13. The plate 13 is, in turn, supported by the receiving chamber 6.

The vacuum chamber sections 2, 4, 5 and 6 are comprised of stainless steel and are large and heavy, often extending to a height of 30 feet or more and weighing several hundred pounds. Consequently, a mechanical hoist must be used to move the chamber pieces. Main hoist mechanism 10 is attached to receiving chamber 6 by a bracket 104 which is bolted to the chamber 6 by means of brackets 120 and 122. The hoist mechanism is slid along guide post 11 under the control of the control system 9. The hoist mechanism is operated by a screw (not shown) driven by motor 100 and is utilized to lift and rotate the combination of the receiving chamber 6 and the transition chamber 5 about the axis of guide post 11 and away from the growth chamber 4 in order to permit access to the grown crystal 8 at the end of the growing process. The rotated position is shown in dotted outline 102 in FIG. 2. Alternatively, the receiving chamber 6 can be moved alone by the lift apparatus 10 so that the crystal 8 positioned within the receiving chamber 6 can be recovered. A separate growth chamber hoist 18 is connected to growth chamber 4 to lift and rotate growth chamber 4 when desired, also by means of a motor-driven screw. The rotated position of growth chamber 4 is shown in dotted position 106 in FIG. 2.

Although the primary and growth chamber hoists are necessary during the initial and final operational phases of crystal growing apparatus, during the actual growing process, both the primary and growth chamber hoists are dormant. If a hoist other than the primary hoist is utilized to lift and move portions of the vacuum chamber, its time of utilization is essentially the same as the time the existing hoists are utilized at the initiation of and completion of the crystal growth cycle.

A feeder 16 and a feeder hoist 17 are provided to introduce polycrystalline feed material into the crucible. The hoist 17 moves the feeder 16 as desired by means of a motor-driven screw (not shown) when charging the crucible. The feeder may also be moved into dotted position 108, if necessary. Like the hoist mechanism, upon completion of its feed charge function, the feeder and its accompanying hoist remains dormant throughout the crystal growth cycle and is reactivated only when a subsequent crystal growth process is reinitiated. Thus, the feeder and its accompanying hoist remain dormant over the great majority of the time interval of a crystal growth cycle.

A computerized process control console 9 monitors and controls various parameters of the crystal growing process, such as melt level in the crucible and temperature within a plurality of areas within the transition chamber. The control console 9 also controls other process parameters of the system, such as the rate at which the seed is withdrawn from the melt and the temperature within the transition chamber 5. The process control console 9 is utilized during the time interval the crystal is being grown as well as during the time the crucible is being fed and the time the melt is being formed in the crucible. However, present crystal growing systems have a dedicated process control console. Thus, in a large crystal growing operation where there are several separate growing apparatus in simultaneous use, the functions of the dedicated process control consoles are largely duplicated. The provision of auxiliary and dedicated apparatus for a crystal growing system, which apparatus is utilized during only a small portion of the crystal growth cycle, is undesirable because it substantially increases the cost of the overall crystal growth apparatus.

Figure 3:
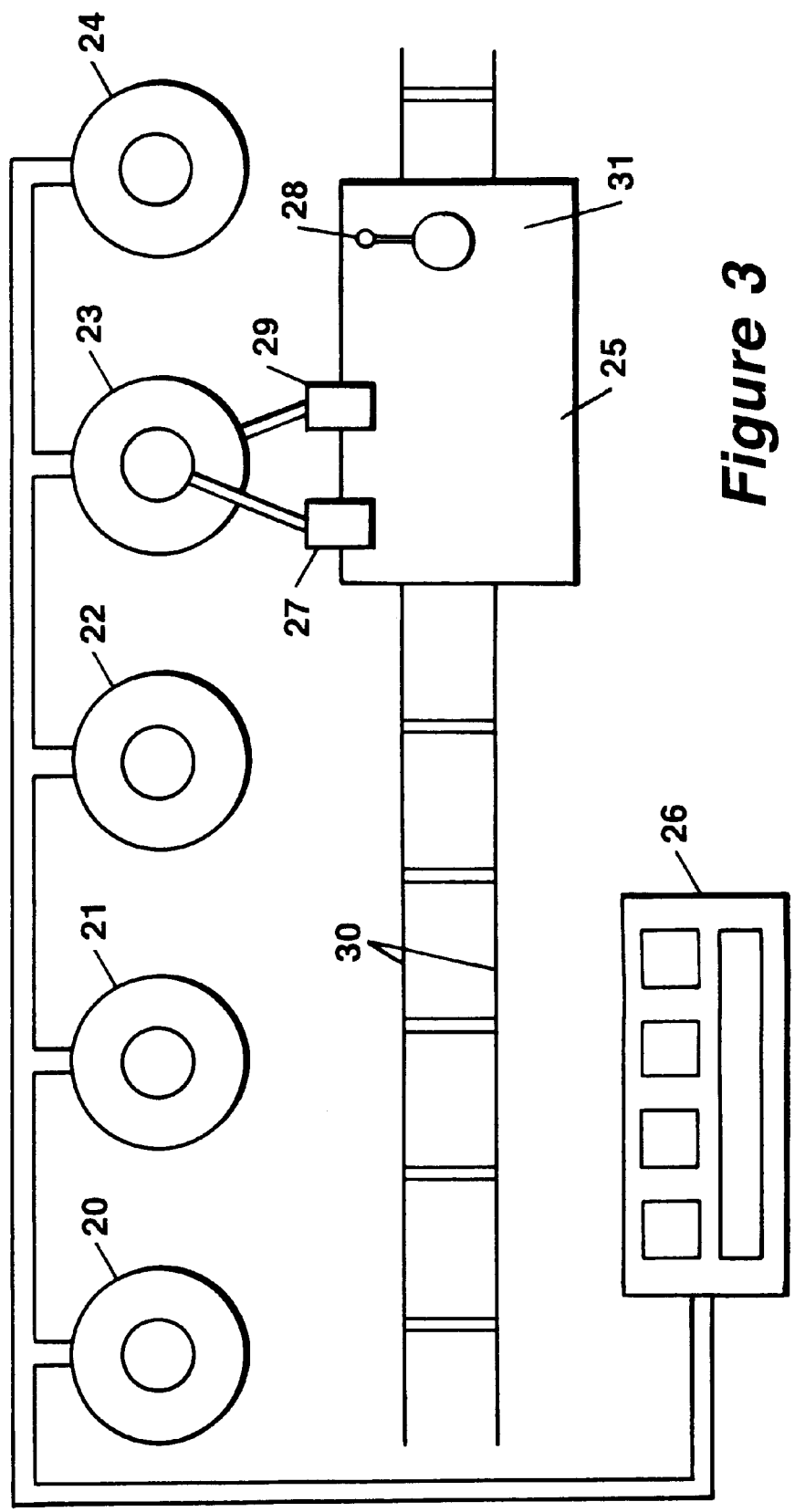
FIG. 3 is a schematic top view of the crystal growing system of this invention which illustratively has five crystal growing stations.
Figure 4:
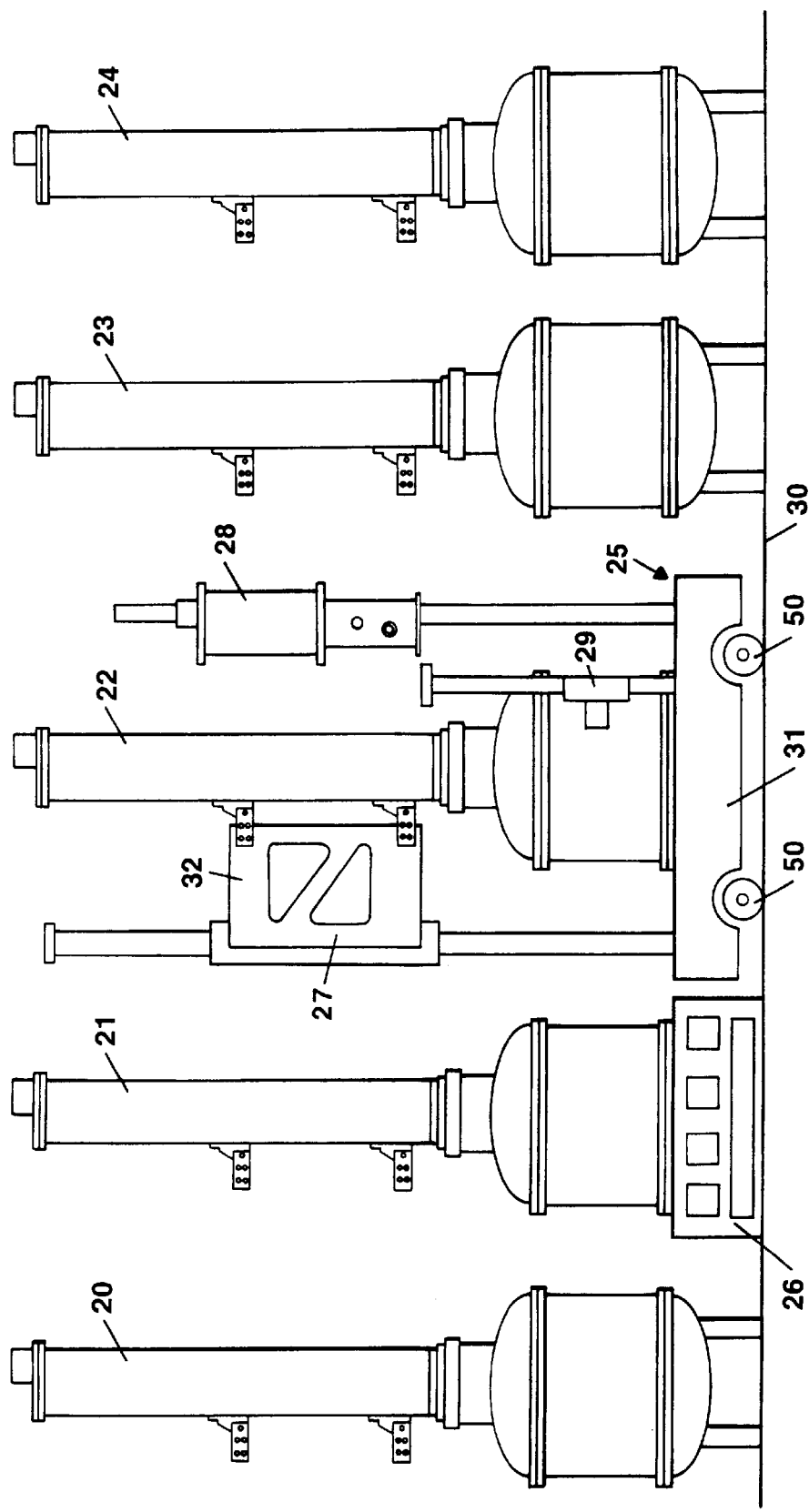
FIG. 4 is front view of the apparatus of this invention as illustrated in FIG. 3.

FIGS. 3 and 4 show top and side views of an embodiment of the present invention. Referring to FIG. 3, the system of this invention is illustrated by the utilization of five crystal growing stations 20, 21, 22, 23 and 24, a single movable server unit 25 and a single control console 26. Each of growing stations 20-24 comprises a crucible, crucible support, vacuum chamber and pulling head, but does not include any hoisting mechanisms or process control units.

The server unit 25 includes a main hoist 27, a feeder and feed hoist 28 and a growth chamber hoist 29 positioned on a support structure 31 mounted on wheels 50 (not shown in FIG. 3) which, in turn, roll on tracks 30 so that the unit 25 can be positioned relative to each crystal growth station as desired. The main hoist 27, the feeder and hoist 28 and the growth chamber hoist 29 operate in the same manner as the previously-described prior art device. For example, when server unit 25 is positioned in front of crystal growing station 22 as shown, main hoist 27 can be coupled by bolting arm 32 to the receiving chamber of station 22 in order to lift the receiving chamber. The movable server unit can be driven by internal power or an external device such as a tractor can be used to move the unit.

The movable server unit substantially reduces the need for auxiliary hoist apparatus for a plurality of crystal growing stations. In addition, it permits greater utilization of the auxiliary hoist apparatus as a percentage of the total time the crystal growth apparatus, including the hoist apparatus, is utilized.

The central control console 26 is provided with appropriate computer and software capacity, as well as electrical converters to display and control operating conditions in all crystal growing stations 20, 21, 22, 23 and 24 independent of each other.

FIG. 4 is a side view of the illustrative crystal growing system which illustrates growing stations 20-24, central server unit 25 and central control console 26.

FIG. 5 illustrates the utilization of an illustrative crystal growing system which is comprised of five crystal growing stations of the Czochralski type as described above, a single server unit and a single process control console. The system is utilized in two time periods comprising a first period 38 and a second period 39, where time is represented in the figure by the horizontal axis increasing towards the right. For illustrative purposes, each division along the horizontal axis equals six hours time.

As illustrated, a typical processing cycle for an individual crystal growing station, comprises an initial stage of approximately six hours duration in which the station crucible is charged, the vacuum chambers are assembled and the charge material is melted in the crucible; a middle stage of approximately sixty hours duration in which crystal formation takes place and a final stage of approximately six hours duration in which the station is cooled, disassembled and the grown crystal is recovered. An additional time duration of 1.5 hours is provided in the final stage in which the server unit can be moved from one station to another station.

The illustrative two period operating schedule used with five crystal growing stations is shown in FIG. 5 and spans approximately 198 hours. During the first time period 38, a first crystal growing station operates with a processing cycle including an initial stage 40, a middle stage 42 and final stage 44. The same station operates with a processing cycle including an initial stage 46, a middle stage 48 and a final stage 50 in the second time period 39.

A second crystal growing station operates with a processing cycle with an initial stage 52, a middle stage 54 and a final stage 56 in the first time period and a second processing cycle having an initial stage 58, a middle stage 60 and a final stage 62 in the second time period. The second crystal growing station also has a dormant period 55 in the first time period, during which dormant period the station waits for the server unit to become available. During the time period 55, the server unit is being used by the first station for initial preparation during its second time period.

A third station has a processing cycle including a first stage 64, a middle stage 66 and a final stage 68 in the first time period and a processing cycle with a first stage 70, a middle stage 72 and a final stage 74 in the second time period. The third crystal growing station also has a dormant period 67 during the first time period in which it awaits the availability of the server unit. During time period 67, the server unit is being used first for final servicing of station 2 during the first time period and then for initial processing of station 2 during the second time period.

A fourth station has processing cycle with an initial stage 76, a middle stage 78 and a final stage 80 in a first time period and a processing cycle with an initial stage 82, a middle stage 84 and a final stage 86 in a second time period. The fourth crystal puller apparatus has a dormant period 79 in the first time period during which time it awaits the availability of the server unit.

The fifth station has a processing cycle with an initial stage 88, a middle stage 90 and a final stage 92 in a first time period and a processing cycle with first stage 94, a middle stage 96 and a final stage 98 in a second time period. The fifth crystal puller apparatus also has a dormant period 91 in the first time period during which time it awaits the availability of the server unit.

The server unit is used in sequence during the first time period to service the initial processing stages of the five stations as illustrated by the sequence of time periods 40, 52, 64, 76 and 88. Next, the final processing stage 44 of the first station is performed with the server unit followed by the first station initial processing stage 46 during the second time period. The final stage 56 of the second station during the first time period is completed followed by the initial stage 58 of the second station during the second time period.

The final stage 68 of the third station in the first time period is then completed followed by the initial processing stage 70 of the third station during the second time period. The final stage 80 of the fourth station during the first time period is next completed followed by the initial processing stage 82 of the fourth station during the second time period.

The server unit then is utilized to complete the final processing stage 92 of the fifth station during the first time period followed by completion of the initial processing stage 94 during the second time period of the fifth station. The hoist server then is utilized to effect, in sequence, the final stages 50, 62, 74, 86 and 98 of all five stations.

The total time that the server unit of the inventive system is utilized within the total processing time of 198 hours is from time A to time B or about 120 hours. This utilization time of the server unit is the sum of usage time in the initial stages 40, 52, 64, 76 and 88 in the first time period; the sum of usage time in the final stages 44, 56, 68, 80 and 92 in the first time period; the sum of usage time in the initial stages 46, 58, 70, 82 and 94 of the second time period and the sum of the usage time during the final stages 50, 62, 74, 86 and 98 of the second time period. Thus, a single set of hoists and feeder apparatus is utilized to serve five crystal growing stations during approximately 60 percent of the total time needed for the station processing cycles during the two time periods. The total travel time of the server unit (at 1.5 hours between stations) is about 27 hours.

The sum of the dormant time during processing for the five crystal stations during the two time periods is approximately 57 hours. Time period 57 represents the portion of the processing time between the initiation of final stage 56 and the initiation of dormant period 67. Dormant time period 75 comprises the concomitant dormant times 67 and 79 while dormant time 89 comprises the concomitant dormant times 79 and 71. When considering the overlapping concomitant dormant time, the total time period any portion of the system is dormant is about 51 hours.

A comparable crystal growing system of the prior art requires five hoists and five feeder apparatus; one set for each crystal growing system. In addition, each hoist and feeder is utilized over only about 16% of the total time the entire apparatus is activated. Thus, as shown in the illustrative example, the crystal growing system of this invention provides greatly improved advantages over comparable systems of the prior art, both in terms of economics and in terms of effective utilization of auxiliary apparatus for a crystal growing process.

While the invention has been shown and described above with respect to various preferred embodiments, it will apparent that the foregoing and other changes of the form and detail may be made therein by one skilled in the art without departing from the spirit and scope of the invention.

What is claimed is:

1. A crystal growing system for producing crystals in a plurality of crystal growing stations, each station having a crucible and a chamber enclosing the crucible, the station growing crystals in a processing cycle having an initial processing stage, a middle processing stage and a final processing stage, the system comprising:

a movable server unit including a first hoist;

means for moving the server unit sequentially to each of the stations;

means for attaching the first hoist to the chamber at each of the stations so that the each station chamber can be moved during the initial and final processing stages.

2. The system of claim 1 wherein each station chamber includes several separable parts and the movable server unit comprises a second hoist for moving at least one component part of the chamber.

3. The system of claim 1 wherein the movable server unit comprises a feeder unit for charging the crucible.

4. The system of claim 3 wherein the feeder unit comprises a third hoist for positioning the feeder unit relative to the crucible.

5. The system of claims 1–4 further comprising a process control console electrically connected to each of the crystal growing stations for monitoring and controlling the processing cycle.

6. The system of claim 1 wherein the movable server unit comprises means for moving the unit over rails placed in proximity to each of the stations.

7. A method for producing crystals in a plurality of crystal growing stations, each station having a crucible and a chamber enclosing the crucible, the station growing crystals in a processing cycle having an initial processing stage, a middle processing stage and a final processing stage, the method comprising the steps of:

A. moving a common server unit having a first hoist sequentially to each of the stations; and B. attaching the first hoist to the chamber at each of the stations so that the each station chamber can be moved during the initial and final processing stages.

8. The method of claim 7 wherein each station chamber includes several separable parts and the common server unit has a second hoist and step A comprises the step of:

A1. using the second hoist in the movable server unit to move at least one component part of the chamber.

9. The method of claim 7 wherein the movable server unit comprises a feeder unit for charging the crucible and wherein the method comprises the further step of:

C. positioning the feeder unit to charge the crucible during the initial processing stage.

10. The method of claim 9 wherein the feeder unit comprises a third hoist and step C comprises the step of:

C1. positioning the feeder unit relative to the crucible with the third hoist.

11. The method of claims 7–10 further comprising the steps of:

D. electrically connecting a single process control console to each of the crystal growing stations; and E. using the process control console to monitor and control the processing cycle at each of the stations.

12. The method of claim 7 wherein step A comprises the step of:

A2. moving the movable server unit over rails placed in proximity to each of the stations.

13. The method of claim 7 further comprising the step of:

F. staggering the processing cycles of each of the stations relative to each other to maximize usage of the movable server unit.

\* \* \* \* \*